(12) United States Patent
Dake

(10) Patent No.: US 12,273,099 B2
(45) Date of Patent: Apr. 8, 2025

(54) DRIVER WITH ADAPTIVE DRIVE STRENGTH

(71) Applicant: TEXAS INSTRUMENTS INCORPORATED, Dallas, TX (US)

(72) Inventor: Tuli Dake, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 41 days.

(21) Appl. No.: 18/323,987

(22) Filed: May 25, 2023

(65) Prior Publication Data

US 2024/0396542 A1    Nov. 28, 2024

(51) Int. Cl.
    H03K 17/0812    (2006.01)
    H03K 3/017    (2006.01)
    H03K 3/3565    (2006.01)
    H03K 19/0944    (2006.01)

(52) U.S. Cl.
    CPC ....... *H03K 17/08122* (2013.01); *H03K 3/017* (2013.01); *H03K 3/3565* (2013.01); *H03K 19/0944* (2013.01)

(58) Field of Classification Search
    CPC ............. H03K 17/08122; H03K 3/017; H03K 3/3565; H03K 19/0944
    See application file for complete search history.

(56) References Cited

U.S. PATENT DOCUMENTS 9,525,421 B2 * 12/2016 Potluri ........... H03K 19/018521

* cited by examiner

*Primary Examiner* — Metasebia T Retebo
(74) *Attorney, Agent, or Firm* — Charles F. Koch; Frank D. Cimino

(57) ABSTRACT

A driver includes a first pre-driver having a first drive strength programming input and a first output, a first transistor having a first transistor control input coupled to the first output, and a second pre-driver having a second drive strength programming input and a second output. The driver also includes a second transistor having a second transistor control input coupled to the second output. The second transistor is coupled to the first transistor and to a driver output terminal. A circuit is coupled between the driver output terminal and the first drive strength programming input and between the driver output terminal and the second drive strength programming input.

20 Claims, 12 Drawing Sheets

DRIVER WITH ADAPTIVE DRIVE STRENGTH

BACKGROUND

An electrical circuit includes any of a variety of electrical components such as transistors, resistors, capacitors, diodes, inductors, etc. Electrical circuits can perform any of a multitude of different functions. It is possible that an electrical overstress condition may occur, which may be harmful to one or more of the components of the electrical circuit.

SUMMARY

In one example, a driver includes a first transistor coupled between a power supply terminal and a driver output terminal. The first transistor has a first transistor control terminal. A second transistor is coupled between the driver output terminal and a power supply reference terminal. The second transistor has a second transistor control terminal. A first pre-driver has a first pre-driver control input and a first pre-driver output. The first pre-driver output is coupled to the first transistor control terminal. The first pre-driver is configured to turn on and off the first transistor. The first pre-driver has an adaptable drive strength. A second pre-driver has a second pre-driver control input and a second pre-driver output. The second pre-driver output is coupled to the second transistor control terminal. The second pre-driver is configured to turn on and off the second transistor. The second pre-driver has an adaptable drive strength. A circuit is coupled to the driver output terminal and is configured to: responsive to a voltage at the driver output being smaller than a supply voltage at the power supply terminal, adapt the first pre-driver for a lower drive strength, and responsive to the voltage at the driver output being equal to the supply voltage, adapt the first pre-driver for a higher drive strength, and responsive to a voltage at the driver output being larger than a power supply reference voltage at the power supply reference terminal, adapt the second pre-driver for a lower drive strength, and responsive to the voltage at the driver output being equal to the power supply reference voltage, adapt the second pre-driver for a higher drive strength.

DETAILED DESCRIPTION

Figure 1:
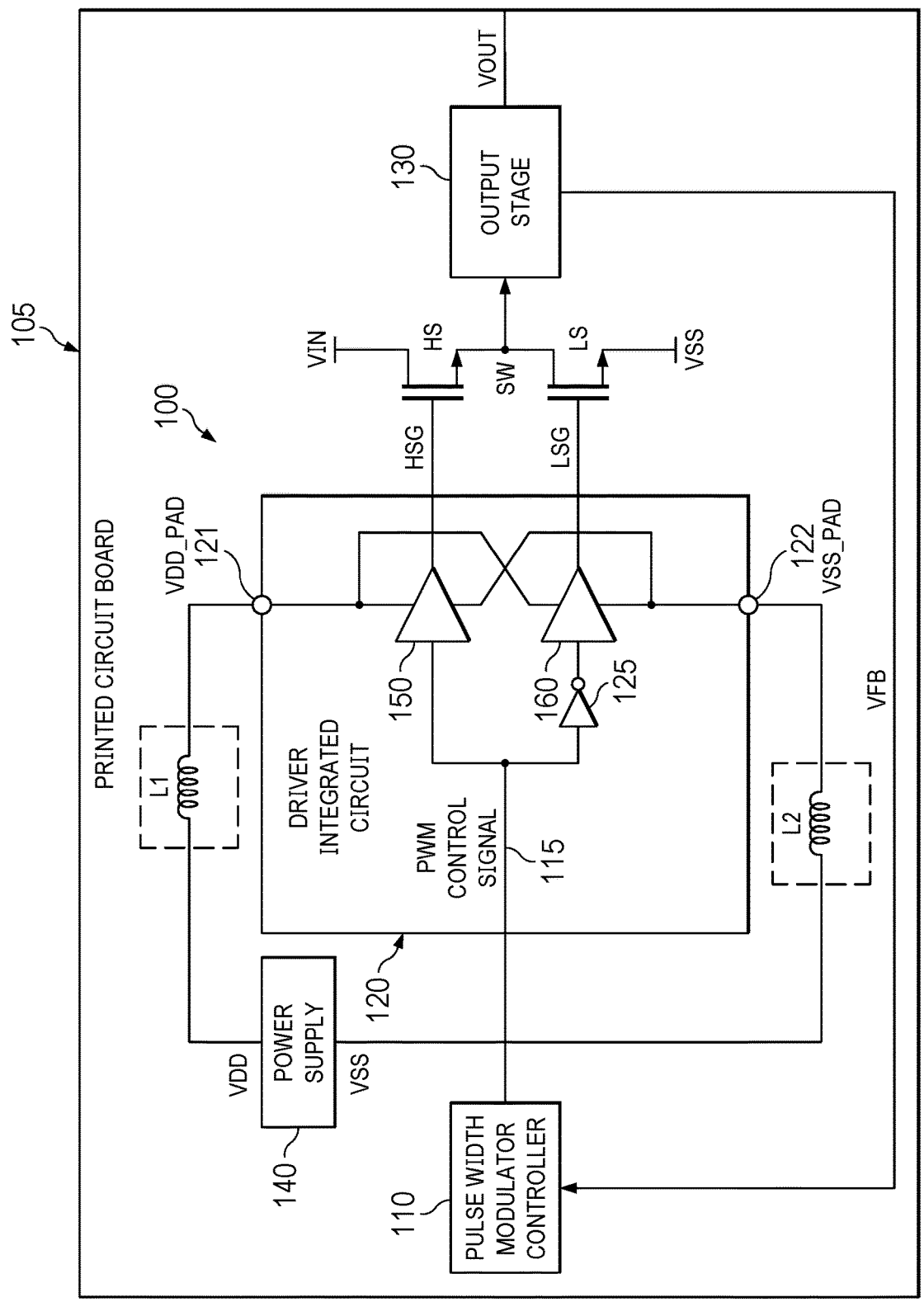
FIG. 1 is a circuit schematic of an electrical system that includes transistor drivers that may be subject to electrical overstress conditions, in an example.

The same reference numbers or other reference designators are used in the drawings to designate the same or similar (either by function and/or structure) features.

The examples described herein pertain to drivers with adaptable drive strength for discharging energy from a parasitic inductance to protect a transistor within the driver from an electrical overstress condition. However, the principles described herein can be applied to other applications in addition to drivers.

FIG. 1 is a circuit schematic of an example system 100 which includes a pulse width modulator (PWM) controller 110, a driver integrated circuit (IC) 120, a high side (HS) transistor, a low side (LS) transistor, an output stage 130, and a power supply 140. The power supply 140 provides a supply voltage (VDD referenced to VSS) to power supply terminals 121 (VDD_PAD) and 122 (VSS_PAD) of the driver IC 120 (connections shown) and to the PWM controller 110 (connections not shown). The HS transistor and the LS transistor are n-channel field effect transistors (NFETs) in this example. The voltage on the gate of the HS transistor is HSG, and the voltage on the gate of the LS transistor is LSG. The source of the HS transistor is coupled to the drain of the LS transistor at a switch node (SW). The output stage 130 is coupled to the SW node. The output stage 130 may produce an output voltage (VOUT). The output stage 130 also generates a feedback voltage (VFB) which is proportional to the output voltage (e.g., via a resistor divider, not shown). The feedback voltage VFB is provided to an input of the PWM controller 110, and the PWM controller (which may be fabricated as an IC separate from the driver IC 120) produces a PWM control signal 115. The driver IC 120 includes a high side driver 150 and a low side driver 160, which control the ON and OFF state of the respective HS and LS transistors. The PWM control signal 115 is provided to an input of the high side driver 150, and, through inverter 125, the logical inverse of the PWM control signal 115 is provided to an input of the low side driver 160. The PWM controller 110, driver IC 120, HS and LS transistors, the output stage 130, and the power supply 140 may be mounted on a printed circuit board (PCB) 105 or other suitable medium for interconnecting the components.

System 100 may be implemented to provide any of a variety of functions. For example, the system 100 may be a switching voltage converter, such as a buck converter, boost converter, buck boost converter, half bridge converter, full bridge converter, etc. The output stage 130 is specific to the particular type of converter. For example, in the case of a buck converter, the output stage 130 includes an inductor coupled to an output capacitor. One terminal of the inductor is coupled to the switch node. The other terminal of the inductor is coupled to the output capacitor and provides the output voltage VOUT. By way of another example, in the case of a half bridge converter, the output stage 130 includes a transformer. The primary side of the transformer may be coupled to the switch node. The output stage also includes a rectifier coupled to the secondary side of the transformer to produce the output voltage VOUT. In other examples, system 100 may be a motor controller or a class D audio amplifier.

FIG. 1 shows parasitic inductances L1 and L2. Parasitic inductance L1 includes parasitic inductance of the PCB's traces (or other types of conductive elements) between the power supply's VDD output and the VDD_PAD power supply terminal 121 of the driver IC 120. Parasitic inductance L1 also may include the parasitic inductance of the connection (e.g., bond wire, pin) between the PCB and the driver IC's VDD_PAD power supply terminal 121. Similarly, parasitic inductance L2 includes the parasitic inductance of the PCB trace and the PCB/driver IC connection (e.g., bond wire, pin) between the power supply's VSS output and the driver IC's VSS_PAD power supply terminal 122. The parasitic inductances L1 and L2 can cause an electrical overstress condition for the high side driver 150 and/or the low side driver 160, as explained below with respect to FIG. 2.

Figure 2:
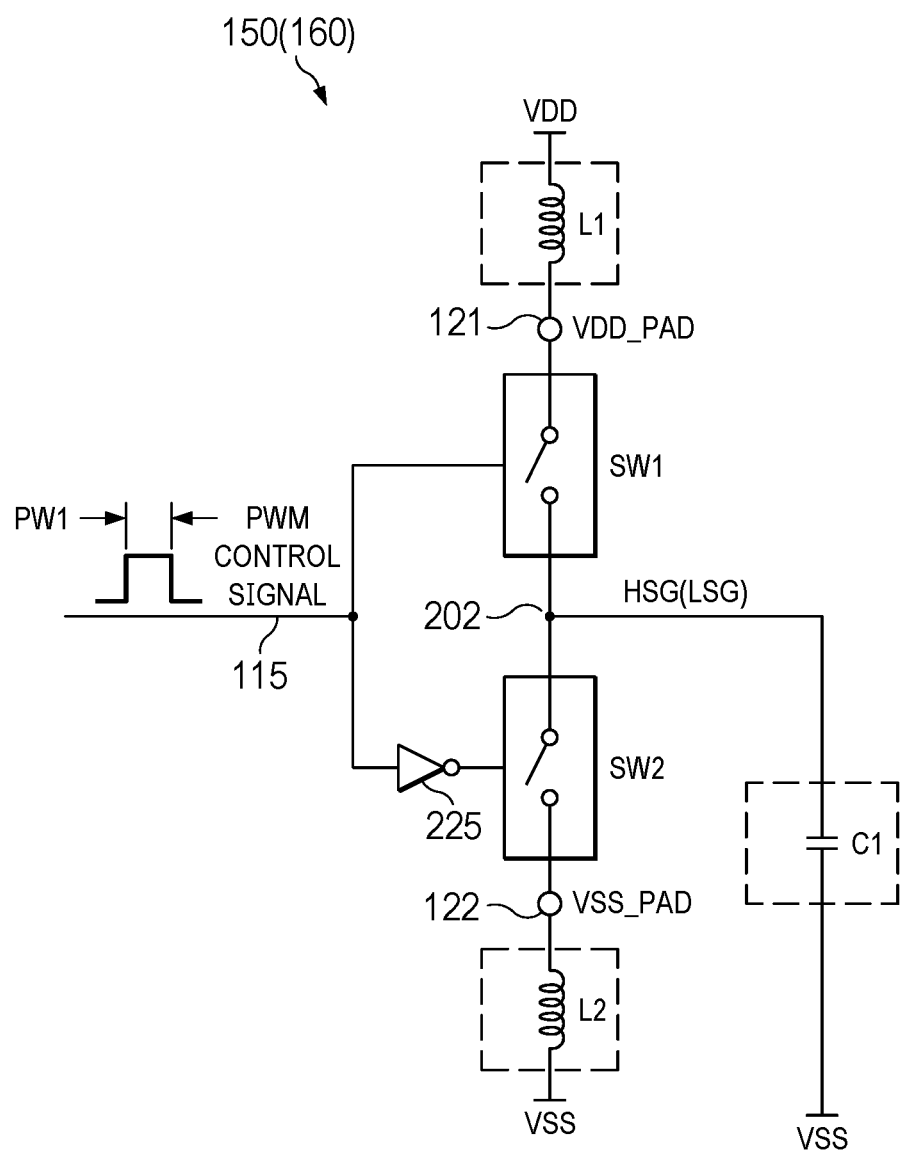
FIG. 2 is a circuit schematic of at least a portion of a driver further illustrating a potential electrical overstress condition, in an example.

FIG. 2 is a circuit schematic of at least a portion of the high side driver 150 and the low side driver 160. The input signal in FIG. 2 is the PWM control signal 115, which is the input signal for the high side driver 150. The input signal for the low side driver 160 is the logical inverse of the PWM control signal 115 through inverter 225, as explained above in the example of FIG. 1. Each driver includes a first switch SW1 coupled in series to a second switch SW2 between VDD_PAD supply terminal 121 and VSS_PAD power supply terminal 122. In one example, switches SW1 and SW2 are transistors, and in one specific example, the transistors are NFETs. The connection 202 between the switches SW1 and SW2 is the output of the driver (and is also referred to as the driver output 202), which is coupled to the gate of the respective HS or LS transistor. In FIG. 2, the HS or LS transistor coupled to the driver is modeled as a capacitive load C1 on the driver 150 (160). The capacitive load C1 represents the gate-to-source capacitance of the respective HS or LS transistor and parasitic capacitance of the PCB and is referred to herein as parasitic capacitance C1.

When the PWM control signal 115 is logic high, switch SW1 is turned ON and SW2 is turned OFF. With switch SW1 ON, current flows from the power supply VDD voltage through the parasitic inductance L1 and switch SW1 to charge the parasitic capacitance C1 of the respective HS or LS transistor. As the current flows to charge the parasitic capacitance C1, the voltage across the parasitic capacitance C1 increases approximately linearly. The voltage across the parasitic capacitance C1 is HSG for the HS transistor (or LSG for the LS transistor). Energy is stored in an inductor as a time-changing current flows through the inductor resulting in a voltage produced across the inductor. As current flows into the gate of the HS (or LS) transistor, the voltage HSG across parasitic capacitance C1 increases, the voltage across parasitic inductance L1 (VDD-HSG) changes, and thus energy is stored in the parasitic inductance L1.

When the parasitic capacitance C1 is fully charged (HSG reaches VDD), the voltage drop across parasitic inductance L1 reduces to approximately 0V and the energy in inductance L1 decreases. Some of the energy is transferred to parasitic capacitance C1 and some is lost thermally. If, at that point (little or no energy stored in inductance L1), the PWM control signal 115 transitions to a logic low state, switch SW1 turns OFF and switch SW2 turns ON, and there is little to no energy in inductance L1 that needs to be discharged.

However, if the PWM control signal 115 transitions to the logic low state while parasitic capacitance C1 is still being charged (i.e., HSG has not yet reached VDD), then when switch SW1 turns off, energy remains stored in parasitic inductance L1, and unless the energy stored in parasitic inductance L1 is discharged, the voltage on the VDD_PAD power supply terminal 121 may increase due to the sudden cessation of current through switch SW1 to the gate of the HS (or LS) transistor. As explained above, switch SW1 is implemented as a transistor. The transistor implementing switch SW1 is rated for maximum acceptable voltages between its terminals. For example, the maximum acceptable drain-to-source voltage (Vds) for the transistor of switch SW1 may be 30V. In this example, a Vds in excess of 30 V may damage the transistor. For this reason, the examples described herein include a discharge circuit to discharge energy that may be stored in the parasitic inductance L1 when switch SW1 is to be turned OFF.

Figure 3A:
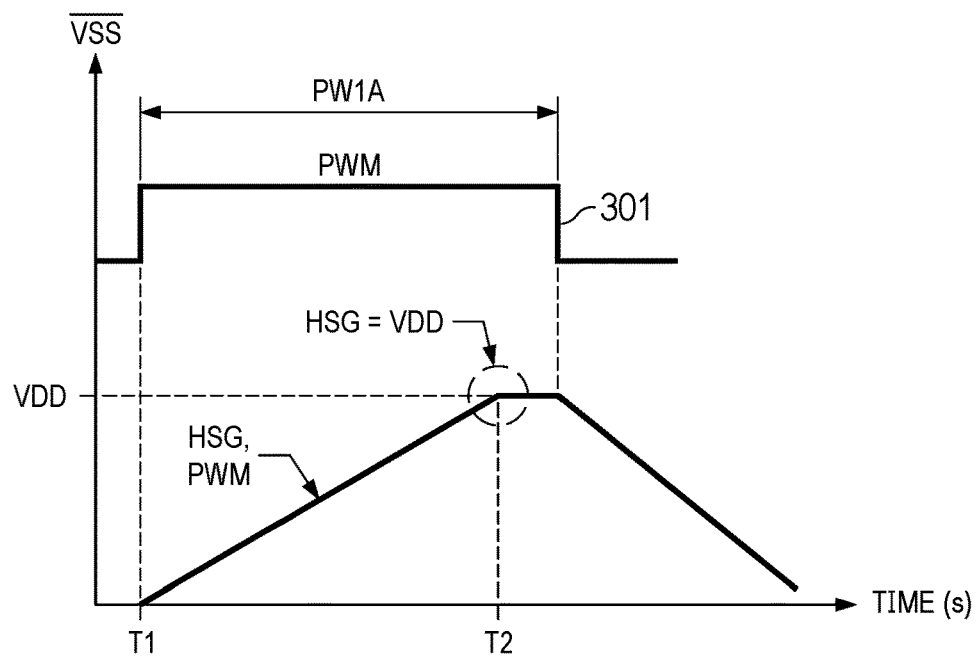
FIG. 3A includes a graph of example waveforms associated with the driver of FIG. 2 in which an electrical overstress condition may not occur.
Figure 3B:
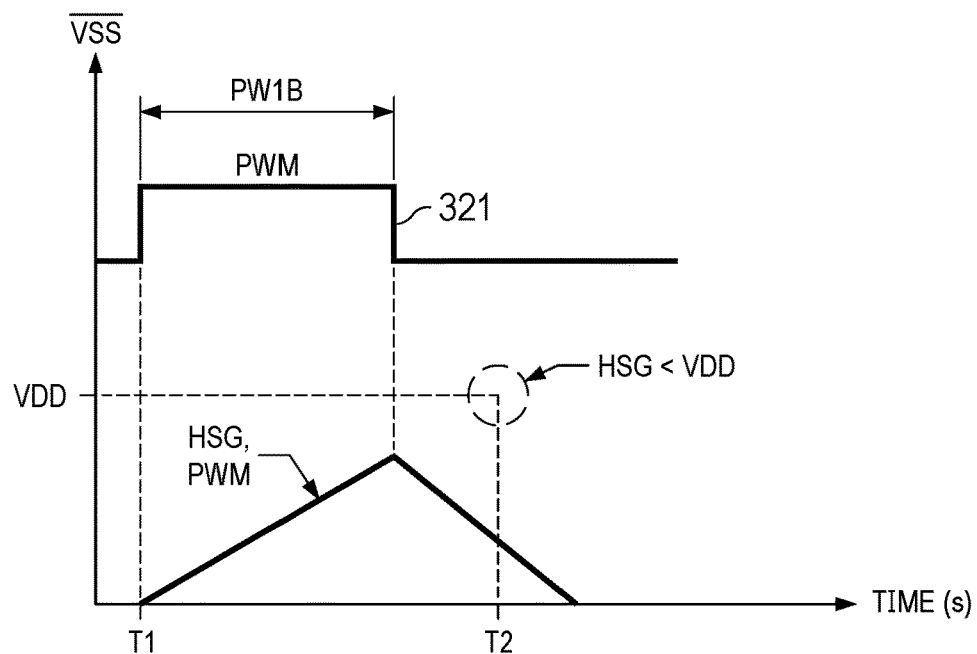
FIG. 3B includes a graph of example waveforms associated with the driver of FIG. 2 in which an electrical overstress condition may occur.

The problem explained above may occur when the pulse width (PW1, FIG. 2) is short enough that the parasitic capacitance C1 of the HS (or LS) transistor does not fully charge to VDD before the end of the pulse of the PWM control signal 115. The problem also may occur if the driver's switch SW2 is not turned on for a long enough period of time to allow the parasitic capacitance C1 to fully discharge to VSS. FIGS. 3A and 3B include signal waveforms collectively illustrating the problem with regard to the high side driver 150.

In FIG. 3A, the width of the PWM pulse is PW1A, and PW1A is long enough that HSG (voltage across parasitic capacitance C1) is able to reach VDD before the end of the PWM pulse (falling edge 301). Because HSG reaches VDD before switch SW1 turns OFF (which occurs upon occurrence of the falling edge 301 of the PWM pulse), there is little or no energy stored in parasitic inductance L1. Similarly (although not illustrated in FIG. 3A), for the low side driver 160, if switch SW2 is on long enough, the LSG signal will reach VSS with little or no residual energy remaining stored in parasitic inductance L2.

In FIG. 3B, however, the width PW1B of the PWM pulse is short enough that HSG did not have time to reach VDD before the falling edge 321 of the PWM pulse occurs to turn off switch SW1. The amount of energy stored in the parasitic inductance L1 is a function of the voltage difference (VDD-HSG) when the current ceases flowing through the switch SW1 and thus through the parasitic inductance L1. Similarly (and not illustrated in FIG. 3B), for the low side driver 160, if switch SW2 is not on long enough, the LSG signal will not reach VSS and thus energy remaining stored in parasitic inductance L2. The width of the pulses of the PWM control signal 115 may vary depending on the load condition on a switching converter. For example, at light loads or start-up of system 100, the width of the PWM pulses may be relatively small.

Figure 4:
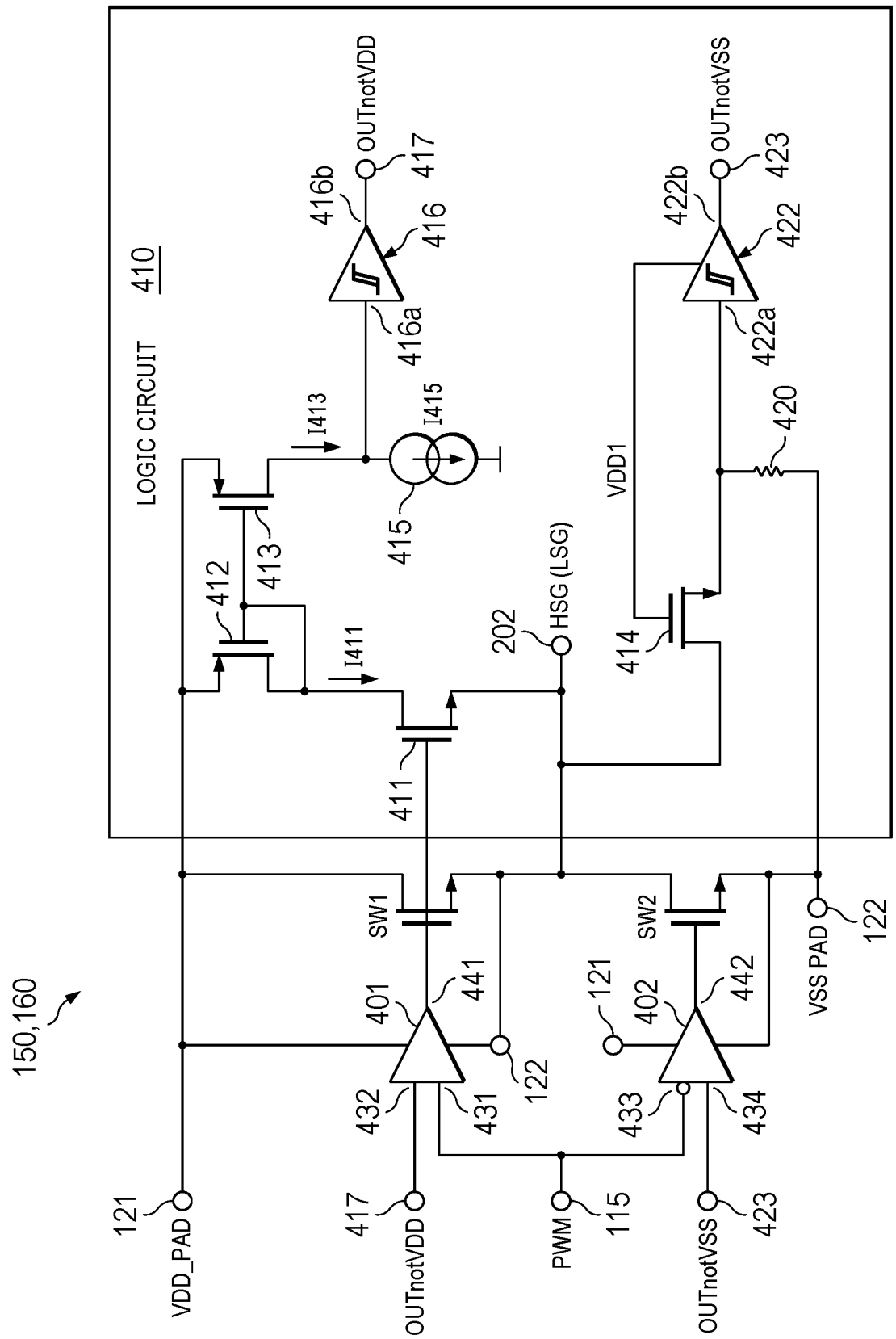
FIG. 4 is a circuit schematic of an example driver having first and second pre-drivers having adaptable drive-strength.

FIG. 4 is a circuit schematic of driver 150. Driver 160 can be implemented with the same circuit. In this example, driver 150 includes switches SW1 and SW2 (described above), pre-drivers 401 and 402, and circuit 410. Pre-driver 401 has an input 431 and an output 441. Pre-driver 401 also has a drive-strength programming input 432. The input 431 of pre-driver 401 receives the PWM control signal 115. The output 441 of pre-driver 401 is coupled to the gate of switch SW1. Pre-driver 401 has power terminals coupled to VDD_PAD power supply terminal 121 and to the source of switch SW1, as shown. Pre-driver 402 has an inverted input 433 and an output 442. The input 433 of pre-driver 402 inverts the PWM control signal 115. Alternatively, the input 433 may not be inverted, and instead can be coupled to an output of an inverter which receives as an input and inverts the PWM control signal 115. Pre-driver 402 also has a drive-strength programming input 434. The output 442 of pre-driver 402 is coupled to the gate of switch SW2. Pre-driver 402 has power terminals coupled to VDD_PAD power supply terminal 121 and VSS_PAD power supply terminal 122.

Example circuit 410 of FIG. 4 includes transistors 411, 412, 413, and 414, a current source circuit 415, resistor 420 and Schmitt trigger circuits 416 and 422. In this example, transistors 412 and 413 are p-channel field effect transistors (PFETs), and transistors 411 and 414 are NFETs. The sources of transistors 412 and 413 are coupled together and to VDD_PAD power supply terminal 121. The gates of transistors 412 and 413 are coupled together and to the drain of transistor 411. The source of transistor 411 is coupled to the driver output 202. Schmitt trigger circuit 416 has an input 416a and an output 416b. Transistors 412 and 413 are configured as a current mirror circuit having a current mirror input at the drain of transistor 412 and a current mirror output at the drain of transistor 413. Current source 415 is coupled to the drain of transistor 413 and to the input 416a of Schmitt trigger 416. Output 416b of the Schmitt trigger circuit 416 is coupled to a first logic signal output OUTnotVDD 417 (the reference numeral 417 can refer to the either or both of the output and the signal provided at the output) of the circuit 410.

The drain of transistor 414 is coupled to driver output 202. Resistor 420 is coupled between the source of transistor 414 and the VSS_PAD power supply terminal 122. The source of transistor 414 is also coupled to input 422a of Schmitt trigger circuit 422. The output 422b of Schmitt trigger circuit 422 is coupled to a second logic signal output 423 (the reference numeral 423 can refer to the either or both of the output and the signal provided at the output). A power supply voltage (e.g., 5V) is coupled to the gate of transistor 414 and to a power terminal of Schmitt trigger circuit 422.

To turn on switch SW1, pre-driver 401 initially forces its output signal to the gate of switch SW1 to a large enough voltage to turn on switch SW1. The same gate voltage is applied to transistor 411. The voltage on the source of transistor 411 may initially be the relatively low voltage of the VSS_PAD power supply terminal 122. The gate-to-source voltage (Vgs) of transistor 411 causes a current I411 to flow through transistor 411 at a magnitude that is a function of the Vgs of transistor 411. Current I411 is mirrored through transistors 412 and 413 as current I413. Initially, current I413 is larger than current I415. Based on current I413 being larger than current I415, the input voltage to Schmitt trigger circuit 416 is large enough to cause the Schmitt trigger circuit to force the first logic signal output OUTnotVDD 417 to a logic high state.

The first logic signal output OUTnotVDD 417 remains logic high as long as current I413 is larger than current I415, which is the case as long as the HSG voltage at driver output 202 is below the voltage VDD_PAD (or more than a small threshold voltage below VDD_PAD). As the HSG voltage at driver output 202 rises with switch SW1 being on, the Vgs of transistor 411 decreases thereby progressively causing a decrease in the magnitude of current I411. When the HSG voltage at driver output 202 rises to be equal to, or within the threshold voltage of, VDD_PAD, the magnitude of current I411 is then at a level that is below the magnitude of current I415. In response, the Schmitt trigger circuit 416 forces the first logic signal output OUTnot VDD 417 to a logic low state.

Accordingly, the first logic signal output OUTnot VDD 417 will be at a first logic state (e.g., logic high) while the HSG voltage is below VDD_PAD (or within a small threshold of VDD_PAD) and will transition to a second logic state (e.g., logic low) when the HSG voltage reaches the level of VDD_PAD (or within the small threshold of VDD_PAD). As described below, the first logic signal OUTnotVDD output 417 can be used to program the turn-off drive strength for pre-driver 401. The first logic signal output 417 of the circuit 410 is coupled to the drive-strength programming input 432 of pre-driver 401. The turn-off drive strength of pre-driver 401 can be programmed based on the logic state of the first logic signal output OUTnotVDD 417. For example, a logic low state of the first logic signal output OUTnotVDD 417 may program the turn-off drive strength of pre-driver 401 for a higher turn-off drive strength for switch SW1, and a logic high state of the first logic signal output OUTnotVDD 417 may program the turn-off drive strength of pre-driver 401 for a lower turn-off drive strength for switch SW1.

When pre-driver 402 turns on switch 402 (and pre-driver 401 turns off switch 401), the HSG voltage at the driver output 202 is pulled downward towards the voltage of the VSS_PAD power supply terminal 122. The HSG voltage at the driver output 202 is also the voltage at the drain of transistor 414. The gate of transistor 414 is biased by a fixed VDD1 voltage (e.g., 5V). While the HSG voltage on the drain of transistor 414 is above the fixed bias voltage at the gate of transistor 414, transistor 414 operates as a source-follower in which its source voltage is approximately the transistor's threshold voltage below its gate voltage. The gate voltage for transistor 414 is large enough that its source voltage is high enough for Schmitt trigger circuit 423 to generate the second logic signal OUTnotVSS 423 at a logic high level.

As the HSG voltage falls towards the voltage of the VSS_PAD power supply terminal 122, eventually the drain voltage of transistor 414 will be below its gate voltage. When the transistor's drain voltage is below its gate voltage, transistor 414 operates as a switch, and the relatively low HSV voltage passes through transistor 414 to the input 422a of the Schmitt trigger circuit 423. The Schmitt trigger circuit 423 responds by forcing the second logic signal OUTnotVSS 423 to a logic low level.

Accordingly, the first logic state (e.g., logic high) for the second logic signal OUTnotVSS 423 indicates that the HSG voltage on driver output 202 has not reached VSS_PAD (which may be the case if switch SW2 is not turned on long enough to fully discharge the gate of the respective HS or LS transistor). The second logic state (e.g., logic low) for the second logic signal OUTnotVSS 423 indicates that the HSG voltage at the driver output 202 has reached the voltage of VSS_PAD (or least within a small threshold level of VSS- _PAD). As described below, the second logic signal OUTnotVSS 423 can be used to program the turn-off drive strength for pre-driver 402 for turning off switch SW2. The second logic signal OUTnotVSS 423 of the circuit 410 is coupled to the drive-strength programming input 434 of pre-driver 402. The turn-off drive strength of pre-driver 402 can be programmed based on the logic state of the second logic signal OUTnotVSS 423. For example, a logic low state of the second logic signal OUTnotVSS may program the turn-off drive strength of pre-driver 401 for a higher turn-off drive strength for switch SW2, and a logic high state of the second logic signal OUTnotVSS may program the turn-off drive strength of pre-driver 402 for a lower turn-off drive strength for switch SW2.

Each pre-driver 401 and 402 can turn on and off the respective switch SW1 and SW2. The drive strength of each pre-driver 401 and 402 is programmable. In one example, the drive strength of each pre-driver for turning off the respective switch SW1/SW2 is programmable, and is referred to as the "turn-off drive strength" of the respective pre-driver. The programmability of the turn-off drive strength of each pre-driver helps to alleviate the problem described above.

For example, if the on time for switch SW1 does not enable the HSG voltage at driver output 202 to reach VDD, then pre-driver 401 is programmed by the first logic signal output OUTnotVDD 417 to turn off switch SW1 with a drive current that is lower than would have been the case if the HSG voltage had been able to reach VDD. By turning off switch SW1 with the lower drive current, the current through switch SW1 decreases more gradually than otherwise would have been the case and, advantageously, provides time for the energy in parasitic inductance L1 to discharge in a controlled fashion, rather than causing VDD_PAD to reach a potentially harmful voltage level.

If the on time for switch SW1 enables the HSG voltage at driver output 202 to reach VDD, then pre-driver 401 is programmed by the first logic signal output OUTnotVDD 417 to turn off switch SW1 with a higher drive current than if the HSG voltage was not able to reach VDD. By turning off switch SW1 with the higher drive current, switch SW1 turns off faster.

Further, if the on time for switch SW2 does not enable the HSG voltage at driver output 202 to fall to VSS, then pre-driver 402 is programmed by the second logic signal output OUTnotVSS 423 to turn off switch SW2 with a drive current that is lower than would have been the case if the HSG voltage had fallen to VSS. By turning off switch SW2 with the lower drive current, the current through switch SW2 decreases more gradually than otherwise would have been the case and, advantageously, provides time for the energy in parasitic inductance L2 to discharge in a controlled fashion, rather than causing VSS_PAD to reach a potentially harmful voltage level.

If the on time for switch SW2 enables the HSG voltage at driver output 202 to reach VSS, then pre-driver 402 is programmed by the second logic signal output OUTnotVSS 423 to turn off switch SW2 with a higher drive current than would have been the case if the HSG voltage had not been able to reach VSS. By turning off switch SW2 with the higher drive current, switch SW2 turns off faster.

Figure 5:
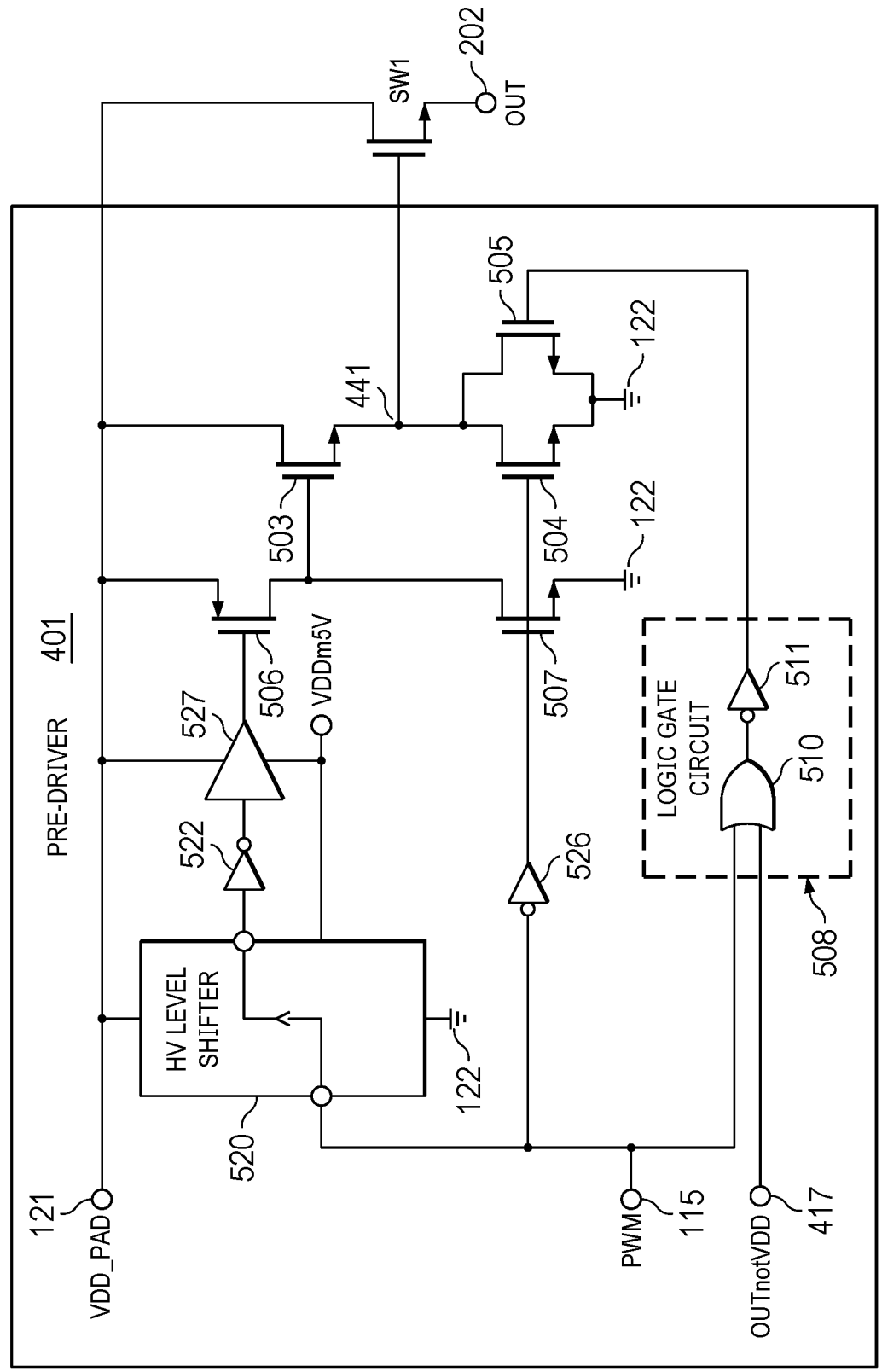
FIG. 5 is a circuit schematic of an example of the first pre-driver of FIG. 4.

FIG. 5 is a circuit schematic of an example pre-driver 401. Pre-driver 401 includes transistors 503, 504, 505, 506, and 507, inverter 522, buffers 526 and 527 (buffer 526 may have inverting input as shown), logic gate circuit 508, and voltage level shifter 520. In this example, transistor 506 is a PFET, and transistors 503, 504, 505, and 507 are NFETs. The drain of transistor 503 is coupled to the source of transistor 506 and to the VDD_PAD power supply terminal 121. The source of transistor 503 is coupled to the drains of transistors 504 and 505 and to the output 441 of pre-driver 401. The sources of transistors 504 and 506 are coupled together and to the VSS_PAD power supply terminal 122. Transistors 506 and 507 are coupled in series between the VDD_PAD power supply terminal 121 and the VSS_PAD power supply terminal 122. The output of inverter 522 is coupled through buffer 527 to the gate of transistor 506. The PWM control signal 115 is provided to an input of voltage level shifter 520. The voltage level shifter 520 adjusts the voltage of the PWM control signal 115 to a suitable level to turn on and off transistor 506. The output of the voltage level shifter 520 is coupled to an input of inverter 522. The output of buffer 526 is coupled to the gate of transistor 507. The PWM control signal 115 is provided to the input of buffer 526.

In this example, logic gate circuit 508 includes an OR gate 510 and an inverting buffer 511. One input of OR gate 510 receives the PWM control signal 115. Another input of OR gate 510 receives the first logic signal output OUTnotVDD 417 from the circuit 410. The output of OR gate 510 is coupled to an input of inverting buffer 511, and the output of inverting buffer 511 is coupled to the gate of transistor 505.

When the PWM control signal 115 is logic high, transistor 506 turns on and transistors 504, 505, and 507 turn off (and transistor 505 may already have been off). With transistor 506 on, the voltage on the gate of transistor 503 is pulled upward towards the voltage of the VDD_PAD power supply terminal 121 thereby turning on transistor 503.

When the PWM control signal 115 is logic low, transistor 506 turns off and transistors 504 and 507 turn on. Transistor 505 turns on if the output signal from inverting buffer 511 is logic high, and the output signal from inverting buffer 511 is logic high if the output signal from OR gate 510 is logic low. The output signal from OR gate 510 is logic low if both of the input signals to OR gate 510 (PWM control signal 115 and the first logic signal output OUTnotVDD 417) are logic low. As described above, the first logic signal output OUTnotVDD 417 being logic low indicates that width of the PWM pulse was long enough to allow the HSG voltage at the driver output 202 to have reached the voltage of the VDD_PAD power supply terminal 121, and very little or no energy remains stored in the parasitic inductance L1. In this case, the logic gate circuit 508 also turns on transistor 505 when transistor 504 is also turned on. With both transistors 504 and 505 being on, the pull-down drive strength of the pre-driver 401 will be at its higher level to quickly turn off switch SW1.

However, for a PWM pulse width that is short enough so that the HSG voltage at the driver output 202 was not able to reach (or within the small threshold voltage mentioned above) the voltage of the VDD_PAD power supply terminal 121, the first logic signal output OUTnotVDD 417 will be logic high, and the logic gate circuit 508 responds by preventing transistor 505 from being turned on. In this case, transistor 504 still turns on, but the pull-down drive strength to turn off switch SW1 is smaller than would have been the case if transistor 505 was also on. Decreasing the pull-down drive strength when turning off switch SW1 when the HSG voltage was not able to reach the voltage of the VDD_PAD power supply terminal 121 causes switch SW1 to turn off more slowly thereby allowing the energy in the parasitic inductance L1 to be dissipated.

Figure 6:
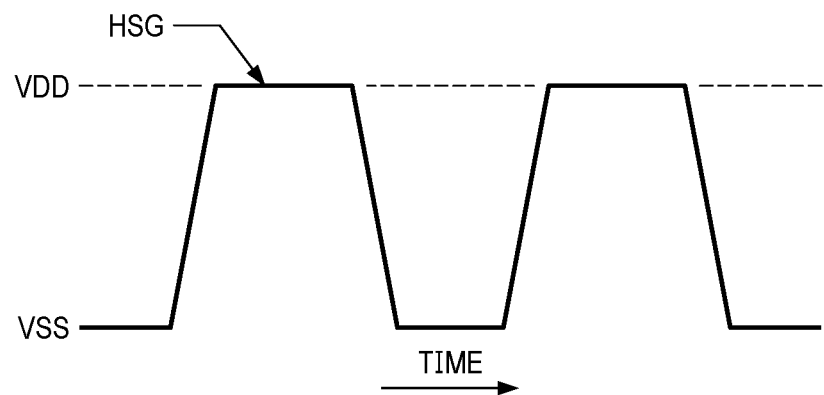
FIG. 6 is a graph illustrating nominal behavior for sufficiently long pulse width modulation (PWM) pulse to allow the driver's output to reach the power supply voltage, in an example.

FIG. 6 is a graph of an example of the HSG voltage at the driver output 202 in which the pulse width of the PWM control signal 115 is long enough to allow the HSG voltage to fully transition between VSS and VDD. For the example of FIG. 6, the logic gate circuit 508 will turn on transistor 505 commensurate with transistor 504 turning on.

Figure 7:
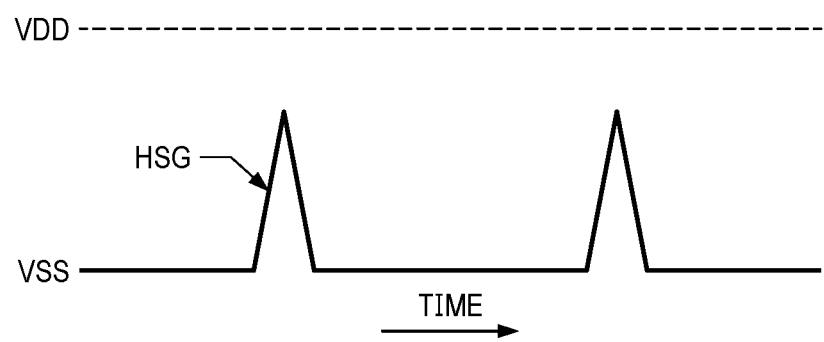
FIG. 7 is a graph illustrating a PWM pulse that is narrow enough such that the driver's output does not reach the power supply voltage, in an example.

FIG. 7 is a graph of an example of the HSG voltage in which the pulse width of the PWM control signal 115 is not long enough to allow the HSG voltage to reach VDD. For the example of FIG. 7, the logic gate circuit 508 will not turn on transistor 505 commensurate with transistor 504 turning on.

Figure 8:
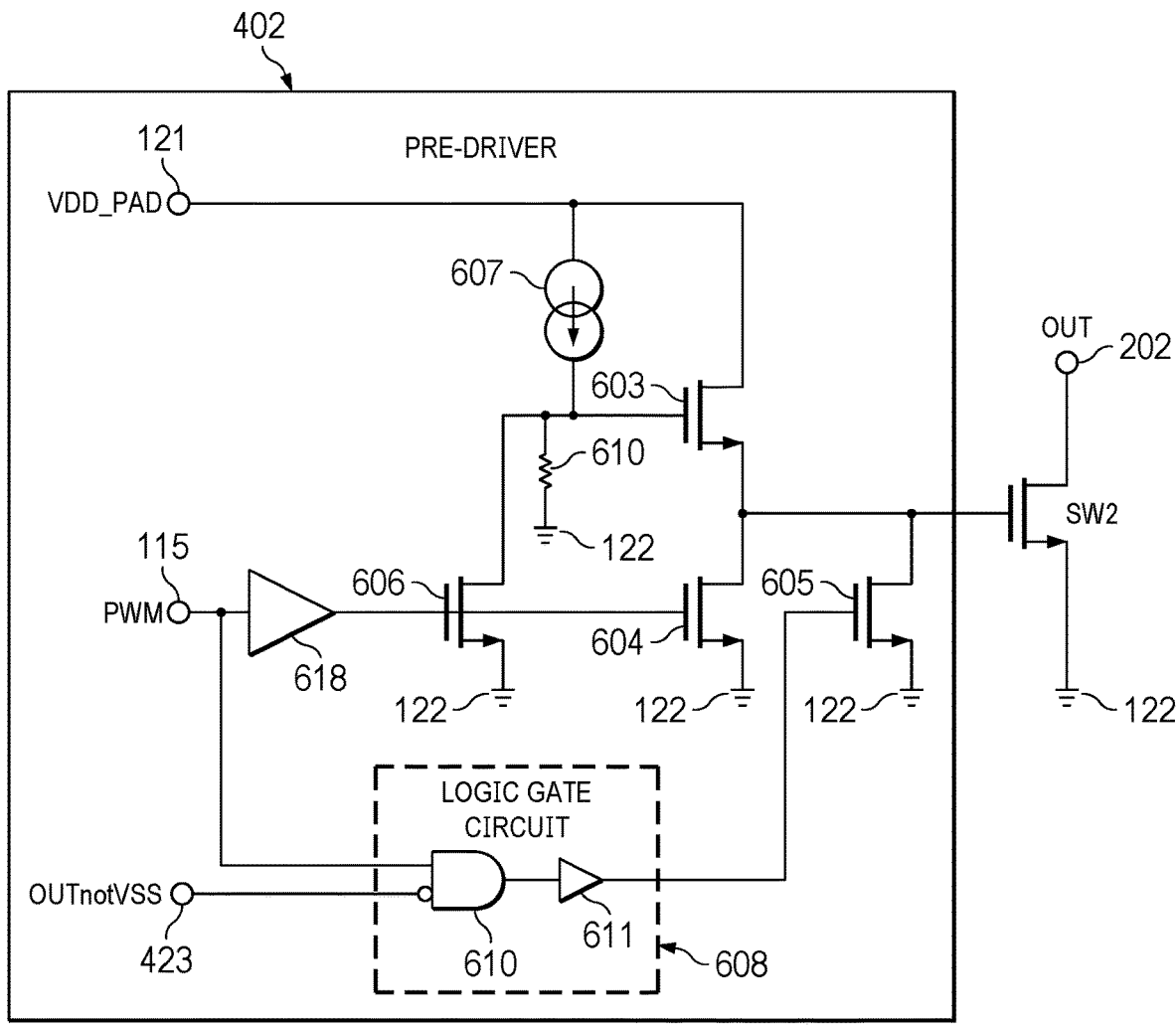
FIG. 8 is a circuit schematic of an example of the second pre-driver of FIG. 4.

FIG. 8 is a circuit schematic of an example pre-driver 402. Pre-driver 402 includes transistors 603, 604, 605, and 606, current source circuit 607, logic gate circuit 608, resistor 610, and buffer 618. In this example, transistors 603-606 are NFETs. Transistors 603 and 604 are coupled in series between the VDD_PAD power supply terminal 121 and the VSS_PAD terminal 122. The source of transistor 603 is coupled to the drain of transistors 604 and 605 and to the gate of switch SW2. Current source circuit 607 is coupled between the VDD_PAD power supply terminal 121 and the gate of transistor 603 and the drain of transistor 606. Resistor 610 is coupled between the current source circuit 607 and the VSS_PAD power supply terminal 122. The PWM control signal 115 is buffered by buffer 618 to drive the gate of transistor 606.

In the example of FIG. 8, logic gate circuit 608 includes AND gate 610 and buffer 611. One input of AND gate 610 is inverted and receives the second logic signal output 423. Another input of AND gate 610 is not inverted and receives the PWM control signal 115. The output of AND gate 610 is coupled to an input of buffer 611, and the output of buffer 611 is coupled to the gate of transistor 606.

When the PWM control signal 115 is logic low, transistors 604 and 606 turn off. With transistor 606 being off, the bias voltage created by the current from current source circuit 607 through resistor 610 is large enough to turn on transistor 603. Transistor 603 being on causes switch SW2 to turn on.

When the PWM control signal 115 is logic high, transistors 604 and 606 turn on. Transistor 606 being on pulls the voltage on the gate of transistor 603 down thereby causing transistor 603 to turn off. In this state switch SW2 turns off.

The output of AND gate 610 will be logic high when the PWM control signal 115 is logic high and the second logic signal output OUTnotVSS 423 is logic low. As described above, the second logic signal output OUTnotVSS 423 will be logic low in response to the HSG voltage at the driver output 202 having fallen to the voltage of the VSS_PAD power supply terminal 122. In response to the PWM control signal 115 being logic high and the second logic signal output OUTnotVSS 423 being logic low, the output buffer 611, which is the output of logic gate circuit 608) will be logic high thereby turning transistor 605 on commensurate with transistor 604 being on. In this state, the pull-down drive strength of pre-driver 402 when turning off switch SW2 will be relatively high thereby quickly turning switch SW2 off.

However, if switch SW2 is not turned on long enough for the HSG voltage at the pre-driver output 202 to decrease all the way to the voltage of (or within a small threshold of) the VSS_PAD power supply terminal 122, the second logic signal output OUTnotVSS 423 will be logic high, which causes the signal at the output of AND gate 610 to be logic low, thereby preventing transistor 605 from turning on. With transistor 605 off, pre-driver 402 is programmed for a lower turn-off drive strength, which causes switch SW2 to turn off more gradually thereby allowing residual energy stored in the parasitic inductance L2 to safely dissipate.

Figure 9:
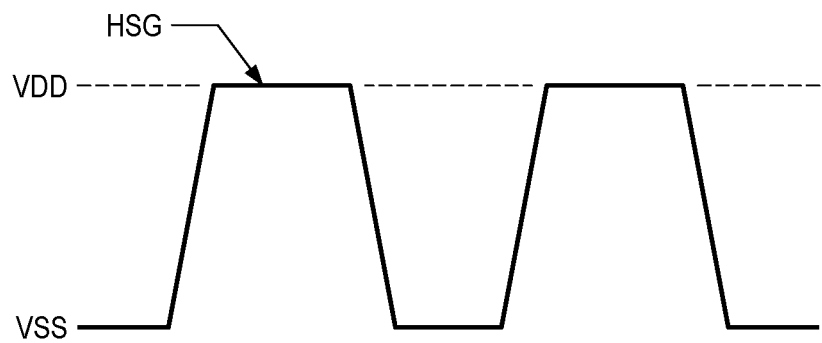
FIG. 9 is a graph illustrating nominal behavior for sufficiently long PWM pulse to allow the driver's output to fall to the power supply reference voltage, in an example.

FIG. 9 is a graph of an example of the HSG voltage at the driver output 202 in which the switch SW2 is turned on long enough so that the HSG voltage is able to fully transition between VDD down to VSS. For the example of FIG. 9, the logic gate circuit 608 will turn on transistor 605 commensurate with transistor 604 turning on.

Figure 10:
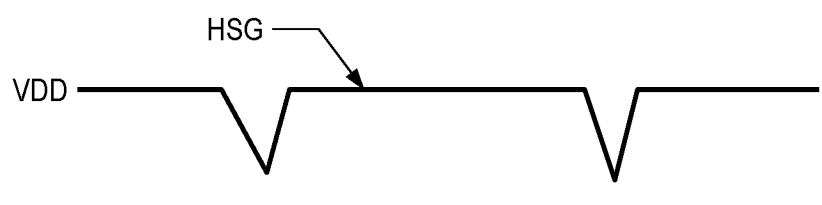
FIG. 10 is a graph illustrating a PWM pulse that is narrow enough such that the driver's output does not reach the power supply reference voltage, in an example.

FIG. 10 is a graph of an example of the HSG voltage in which switch SW2 is not turned on long enough to allow the HSG voltage to reach VSS. For the example of FIG. 10, the logic gate circuit 608 will not turn on transistor 605 commensurate with transistor 604 turning on.

Figure 11:
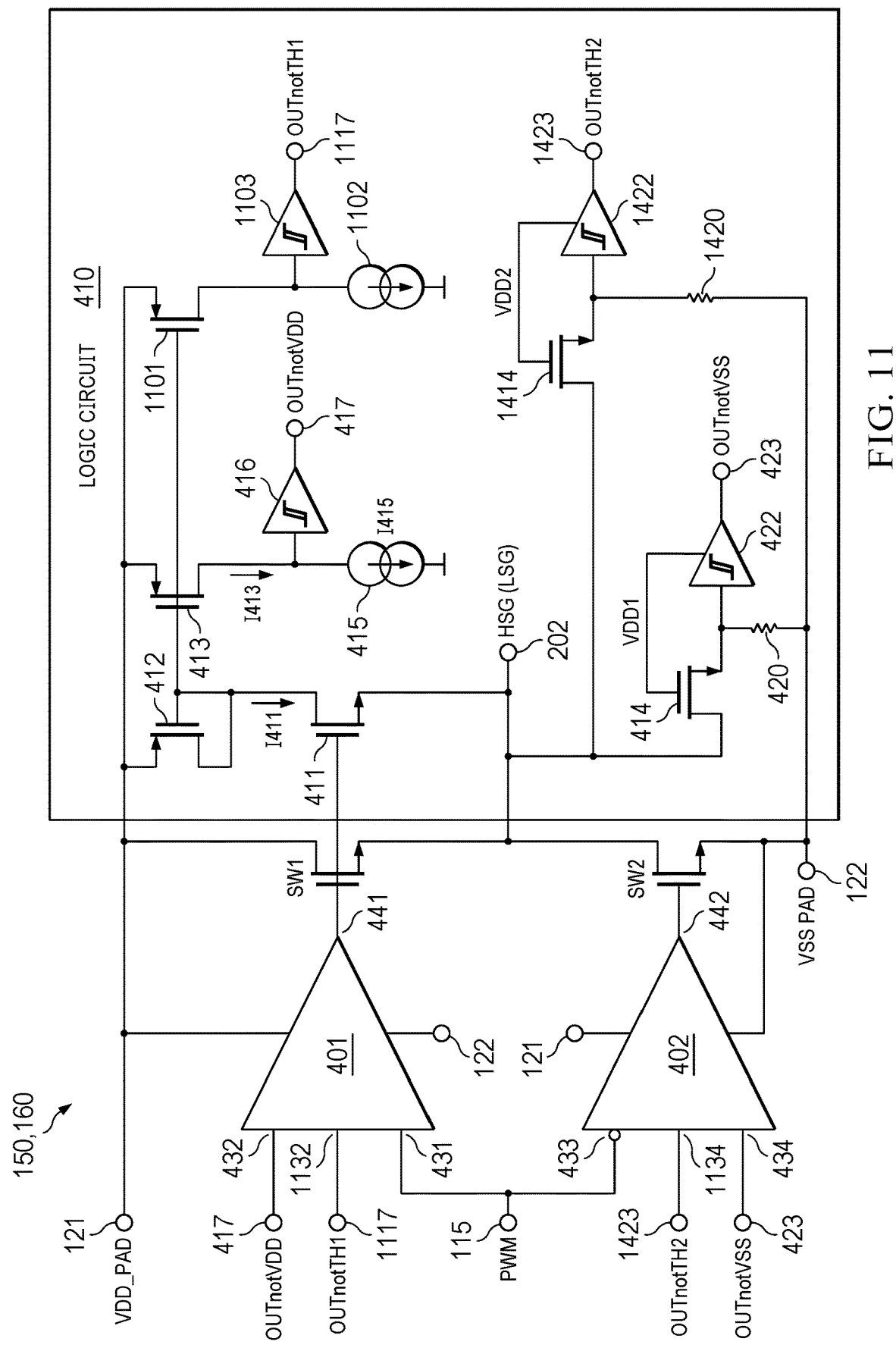
FIG. 11 is a circuit schematic of an example driver having first and second pre-drivers each having three-level adaptable drive-strength.

FIG. 11 is a circuit schematic of high side driver 150 (or low side driver 160) in which the driver can be programmed for three separate turn-off drive strengths, rather than two separate turn-off drive strengths as in the example of FIG. 4. The high side driver 150 of FIG. 11 is largely the same as in FIG. 4 but with several differences. One difference is that the circuit 410 includes additional components to generate four logic signals instead of two logic signals. The four logic signals include OUTnotVDD 417, OUTnotTH1 1117, OUTnotVSS 423, and OUTnotTH2 1423. Further, each of the pre-drivers 401 and 402 in FIG. 11 have an additional drive strength programming input. Pre-driver 401 has a drive-strength programming input 432 and an additional drive-strength programming input 1132. Similarly, pre-driver 402 has a drive strength programming input 434 and an additional drive-strength programming input 1134. For pre-driver 401, logic signal OUTnotVDD 417 is provided to drive-strength programming input 432, and logic signal OUTnotTH1 1117 is provided to drive-strength programming input 1132. For pre-driver 402, logic signal OUTnotVSS 423 is provided to drive-strength programming input 434, and logic signal OUTnotTH2 1423 is provided to drive-strength programming input 1134.

The circuit 410 in FIG. 11 has the same components described above with regard to FIG. 4 to generate the OUTnotVDD 417 and OUTnotVSS 423 control signals and has an additional set of the same components to generate the OUTnotTH1 1117 and OUTnotTH2 1423 control signals. More specifically, circuit 410 in FIG. 11 includes transistor 1101, current source circuit 1102, and Schmitt trigger 1103 coupled together to generate the logic signal OUTnotTH1 in the same manner as transistor 413, current source circuit 415, and Schmitt trigger 416 are coupled together to generate logic signal OUTnotVDD. The magnitude of the current produced by current source circuit 1102 is different (e.g., larger) than the current produced by current source circuit 415. If current source circuit 1102 produces a larger current than current source circuit 415, then Schmitt trigger 1103 will cause control signal OUTnotTH1 to transition from logic low to logic high at a lower HSG voltage at the driver output 202 than for Schmitt trigger 416.

Figure 12:
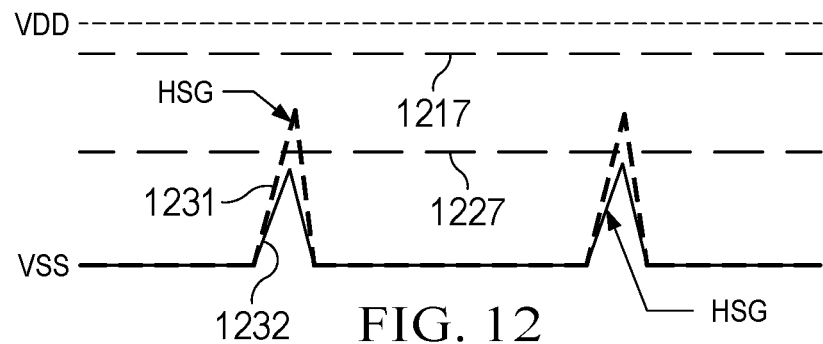
FIGS. 12 and 13 are graphs illustrating multiple voltage thresholds implemented by the driver of FIG. 11 to implement three-level adaptable drive strength, in an example.

FIG. 12 is a graph illustrating the two threshold levels for circuit 410 of FIG. 11 to trigger the activation (e.g., logic low to logic high transition) of control signals OUTnotVDD 417 and OUTnotTH1 117. Dashed threshold 1217 corresponds to the voltage level of HSG that will cause Schmitt trigger 416 to force control signal OUTnotVDD 417 to the logic high state, as described above. Dashed threshold 1227 corresponds to the voltage level of HSG that will cause Schmitt trigger 1103 to force control signal OUTnotTH1 1117 to the logic high state. Two examples of the HSG voltage level are shown in FIG. 12, HSG 1231 has exceeded threshold 1227 but not threshold 1217, and HSG 1232 has not exceeded even threshold 1227.

Referring again to FIG. 11, along with transistor 414, resistor 420, and Schmitt trigger 422 to generate the control signal OUTnotVSS 423, circuit 410 also includes transistor 1414, resistor 1420, and Schmitt trigger 1422 (coupled together in the same manner as transistor 414, resistor 420, and Schmitt trigger 422) to generate the control signal OUTnotTH2 1423. The bias voltage VDD2 applied to the gate of transistor 1414 and to Schmitt trigger 1422 is different (e.g., smaller) than the bias voltage VDD1 applied to the gate of transistor 414 and to Schmitt trigger 422. Accordingly, Schmitt trigger 1422 will force control signal OUTnotTH2 1423 to a logic high level for the HSG voltage at a higher level for the HSG voltage which causes Schmitt trigger 422 to force the control signal OUTnotVSS 423 to a logic high level.

Figure 13:
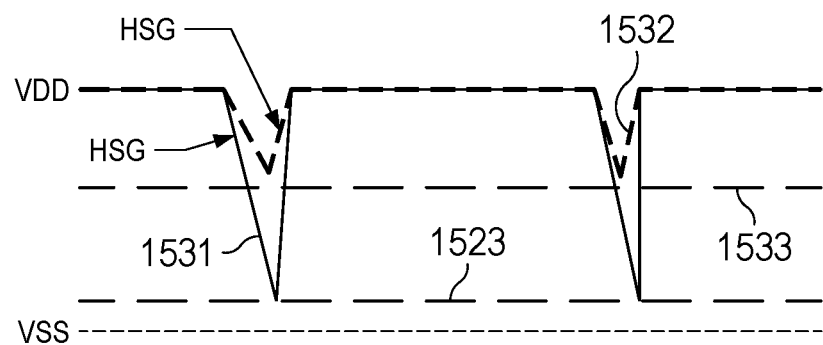

FIG. 13 is a graph illustrating the two threshold levels for the circuit 410 of FIG. 11 to trigger the activation (e.g., logic low to logic high transition) of control signals OUTnotVSS 423 and OUTnotTH2 1423. Dashed threshold 1523 corresponds to the voltage level of HSG that will cause Schmitt trigger 422 to force control signal OUTnotVSS 423 to the logic high state, as described above. Dashed threshold 1533 corresponds to the voltage level of HSG that will cause Schmitt trigger 1422 to force control signal OUTnotTH2 1423 to the logic high state. Two examples of the HSG voltage level are shown in FIG. 13, HSG 1531 has reached threshold 1523, and HSG 1532 has not reached even threshold 1532.

Figure 14:
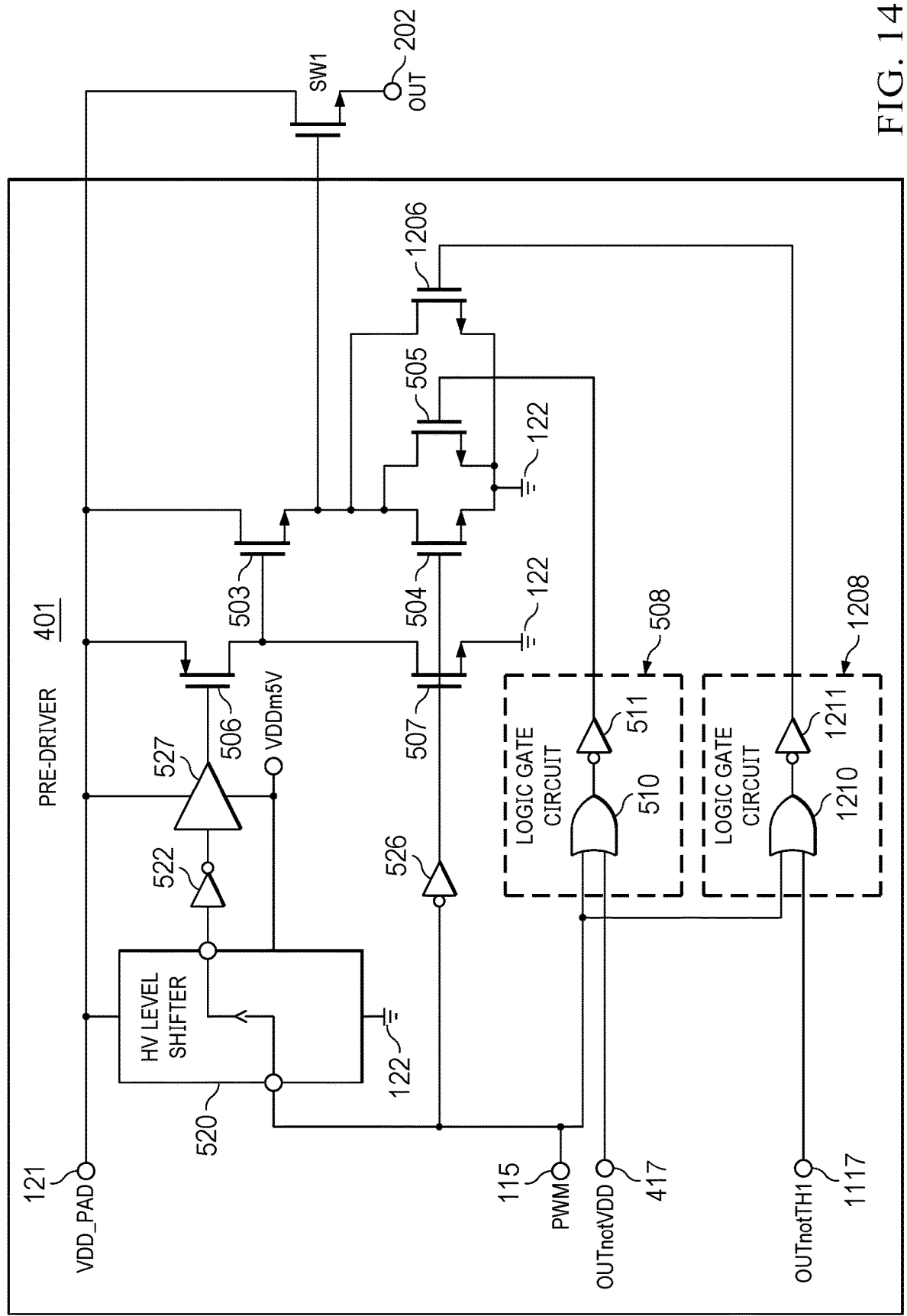
FIG. 14 is a circuit schematic of an example of the first pre-driver of FIG. 11.

FIG. 14 is a circuit schematic of pre-driver 401 of FIG. 11 in which the pre-driver is programmable for three levels of turn-off drive strength. Pre-driver 401 in FIG. 14 is largely the same as that in FIG. 5 with the addition of an additional transistor 1206 and logic circuit 1208. Like logic circuit 508, logic circuit 1208 includes an OR gate 1210 coupled to an inverting buffer 1211. Inputs to OR gate 1210 include the PWM control signal 115 and control signal OUTnotTH1 1117. Transistor 1206 is coupled in parallel with transistors 504 and 505. The output of inverting buffer 1211 (the output of logic circuit 1208) is coupled to the gate of transistor 1206.

If the HSG voltage has increased all the way to (or within a small threshold level of, for example, within 10% of) VDD when the PWM control signal is logic low and turns on transistor 504, both control signals OUTnotVDD 417 and OUTnotTH1 1117 are logic low thereby causing logic circuits 508 and 1208 to turn on both of transistors 505 and 1206 for the highest turn-off drive strength. If the HSG voltage has increased above to a level that is between thresholds 1227 and 1217 (FIG. 12), then control signal OUTnotVDD 417 will be logic high but control signal OUTnotTH1 1117 will be logic low. In response, control circuit 508 will prevent transistor 505 from turning on when transistor 504 is turned on, and logic circuit 1208 will turn on transistor 1206 with transistor 504 thereby decreasing the turn-off drive strength to a second level. If the HSG voltage fails to increase to even threshold 1227, then both control signals OUTnotVDD 417 and OUTnotTH1 1117 will be logic high. In response, control circuits 508 and 1108 will prevent transistors 505 and 1206 from turning on when transistor 504 is turned on, thereby further decreasing the turn-off drive strength to a third level.

Figure 15:
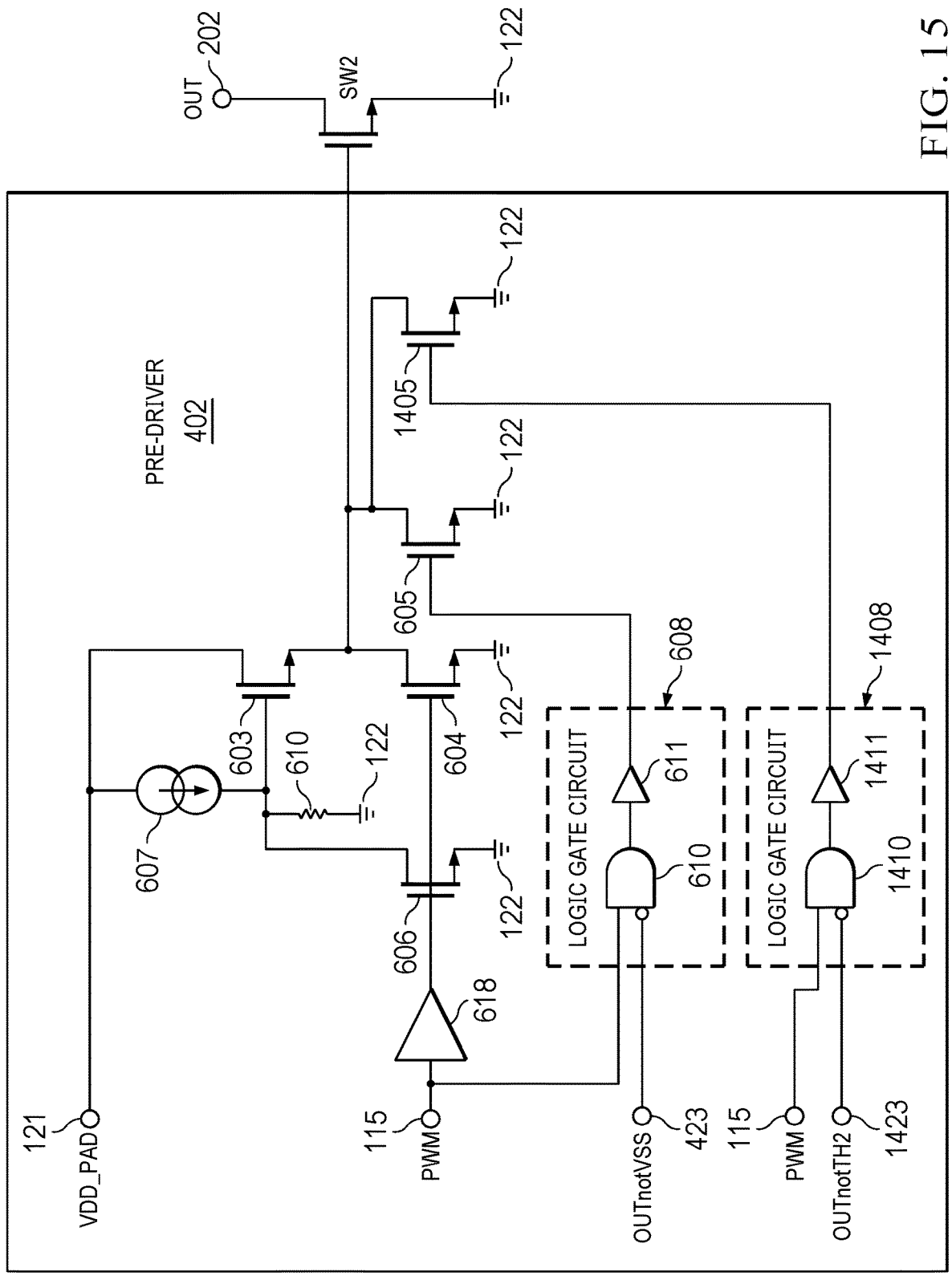
FIG. 15 is a circuit schematic of an example of the second pre-driver of FIG. 11.

FIG. 15 is a circuit schematic of pre-driver 402 of FIG. 11 in which the pre-driver is programmable for three levels of turn-off drive strength. Pre-driver 402 in FIG. 15 is largely the same as that in FIG. 8 with the addition of an additional transistor 1405 and logic circuit 1408. Like logic circuit 608, logic circuit 1408 includes an AND gate 1410 coupled to a buffer 1411. Inputs to ANS gate 1410 include the PWM control signal 115 and control signal OUTnotTH2 1423. Transistor 1405 is coupled in parallel with transistors 604 and 605. The output of buffer 1411 (the output of logic circuit 1408) is coupled to the gate of transistor 1406.

If the HSG voltage has decreased all the way to (or within a small threshold level of) VSS when the PWM control signal is logic high to turn on transistor 604, both control signals OUTnotVSS 423 and OUTnotTH2 1423 are logic low thereby causing logic circuits 608 and 1408 to turn on both of transistors 605 and 1405 for the highest turn-off drive strength. If the HSG voltage has decreased to a level that is between threshold 1523 and 1533 (FIG. 13, then control signal OUTnotVSS 423 will be logic high but control signal OUTnotTH2 1423 will be logic low. In response, control circuit 608 will prevent transistor 605 from turning on when transistor 604 is turned on, and logic circuit 1408 will turn on transistor 1405 with transistor 604 thereby decreasing the turn-off drive strength to a second level. If the HSG voltage fails to decrease to even threshold 1533, then both control signals OUTnotVSS 423 and OUTnotTH2 1423 will be logic high. In response, control circuits 608 and 1408 will prevent transistors 5605 and 1405 from turning on when transistor 604 is turned on, thereby further decreasing the turn-off drive strength to a third level.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/− 10 percent of that parameter or, if the parameter is zero, a reasonable range of values around zero.

Modifications are possible in the described embodiments, and other embodiments are possible, within the scope of the claims.

What is claimed is:

1. A driver, comprising:
    a first transistor coupled between a power supply terminal and a driver output terminal, the first transistor having a first transistor control terminal;
    a second transistor coupled between the driver output terminal and a power supply reference terminal, the second transistor having a second transistor control terminal;
    a circuit having a first circuit output and a second circuit output, the circuit configured to:
        generate a first logic signal at the first circuit output in response to whether a voltage at the driver output terminal is smaller than a supply voltage at the power supply terminal; and
        generate a second logic signal at the second circuit output in response to whether the voltage at the driver output terminal is larger than a power supply reference voltage at the power supply reference terminal;
    a first pre-driver having a first pre-driver control input, a first drive-strength programming input, and a first pre-driver output, the first drive-strength programming input coupled to the first circuit output, the first pre-driver output coupled to the first transistor control terminal, and the first pre-driver configured to turn on and off the first transistor based on a logic state of a pulse width modulation (PWM) signal at the first pre-driver control input, and the first pre-driver configured to have an adaptable drive strength based on a logic state of the first logic signal; and
    a second pre-driver having a second pre-driver control input, a second drive-strength programming input, and a second pre-driver output, the second drive-strength programming input coupled to the second circuit output, the second pre-driver output coupled to the second transistor control terminal, and the second pre-driver configured to turn on and off the second transistor based on the logic state of the PWM signal at the second pre-driver control input, and the second pre-driver configured to have an adaptable drive strength based on a logic state of the second logic signal.

2. The driver of claim 1, wherein:
    the first pre-driver has an adaptable drive strength for turning off the first transistor; and
    the second pre-driver has an adaptable drive strength for turning off the second transistor.

3. The driver of claim 1, wherein the circuit comprises:
    a third transistor having a third transistor control terminal coupled to the first transistor control terminal;
    a current mirror having a current mirror input and a current mirror output, the current mirror input coupled to the third transistor;
    a current source circuit coupled to the current mirror output; and
    a Schmitt trigger circuit having an input and an output, the input of the Schmitt trigger circuit coupled to the current mirror output and the current source circuit, and the output of the Schmitt trigger circuit coupled to the first circuit output.

4. The driver of claim 1, wherein the second transistor has first and second current terminals, and wherein the circuit comprises:

a Schmitt trigger circuit having an input and an output, the output of the Schmitt trigger circuit coupled to the second circuit output;

a third transistor coupled between the first current terminal and the input of the Schmitt trigger circuit; and a resistor coupled between the second current terminal and the input of the Schmitt trigger circuit.

5. The driver of claim 4, wherein the third transistor has a third control terminal coupled to a voltage reference circuit.

6. The driver of claim 1, wherein the first pre-driver comprises:

a third transistor having a third transistor control terminal, the third transistor coupled between the power supply terminal and the first transistor control terminal;

a fourth transistor having a fourth transistor control terminal, the fourth transistor coupled between the first transistor control terminal and the power supply reference terminal, the fourth transistor control terminal coupled to the first pre-driver control input;

a fifth transistor having a fifth transistor control terminal, the fifth transistor coupled between the first transistor control terminal and the power supply reference terminal; and a logic gate circuit having first and second logic gate inputs and a logic gate circuit output, the first logic gate circuit input coupled to the first pre-driver control input, the second logic gate input coupled to the first drive-strength programming input, and the logic gate circuit output coupled to the fifth transistor control terminal.

7. The driver of claim 1, wherein the second pre-driver comprises:

a third transistor having a third transistor control terminal, the third transistor coupled between the power supply terminal and the second transistor control terminal;

a fourth transistor having a fourth transistor control terminal, the fourth transistor coupled between the second transistor control terminal and the power supply reference terminal, the fourth transistor control terminal coupled to the second pre-driver control input;

a fifth transistor having a fifth transistor control terminal, the fifth transistor coupled between the second transistor control terminal and the power supply reference terminal; and a logic gate circuit having first and second logic gate inputs and a logic gate output, the first logic gate input coupled to the second pre-driver control input, the second logic gate input coupled to the second drive-strength programming input, and the logic gate output coupled to the fifth transistor control terminal.

8. The driver of claim 1, wherein:

the first pre-driver has an adaptable drive strength for turning off the first transistor; and the second pre-driver has an adaptable drive strength for turning off the second transistor.

9. The driver of claim 8, wherein:

the first pre-driver has a three-level adaptable drive strength for turning off the first transistor; and the second pre-driver has a three-level adaptable drive strength for turning off the second transistor.

10. A driver, comprising:

a first transistor coupled between a power supply terminal and a driver output terminal, the first transistor having a first transistor control terminal;

a second transistor coupled between the driver output terminal and a power supply reference terminal, the second transistor having a second transistor control terminal;

a first pre-driver having a first pre-driver control input and a first pre-driver output, the first pre-driver output coupled to the first transistor control terminal, the first pre-driver configured to turn on and off the first transistor, and the first pre-driver having an adaptable drive strength; and a second pre-driver having a second pre-driver control input and a second pre-driver output, the second pre-driver output coupled to the second transistor control terminal, the second pre-driver configured to turn on and off the second transistor, and the second pre-driver having an adaptable drive strength; and a circuit coupled to the driver output terminal and configured to:

responsive to a voltage at the driver output terminal being smaller than a supply voltage at the power supply terminal, adapt the first pre-driver for a lower drive strength, and responsive to the voltage at the driver output terminal being equal to the supply voltage, adapt the first pre-driver for a higher drive strength; and responsive to a voltage at the driver output terminal being larger than a power supply reference voltage at the power supply reference terminal, adapt the second pre-driver for a lower drive strength, and responsive to the voltage at the driver output terminal being equal to the power supply reference voltage, adapt the second pre-driver for a higher drive strength.

11. The driver of claim 10, wherein the adaptable drive strength for the first pre-driver is adaptable for turning off the first transistor, and the adaptable drive strength for the second pre-driver is adaptable for turning off the second transistor.

12. The driver of claim 11, wherein the first pre-driver has a programmable three-level drive strength for turning off the first transistor, and the second pre-driver has a programmable three-level drive strength for turning off the second transistor.

13. The driver of claim 10, wherein:

the first pre-driver has a first drive-strength programming input;

the second pre-driver has a second drive-strength programming input; and the circuit has a first circuit output and a second circuit output, the first circuit output coupled to the first drive-strength programming input and the second circuit output coupled to the second drive-strength programming input.

14. The driver of claim 13, wherein the circuit is configured to program the first pre-driver by generating a first control signal at the first circuit output and to program the second pre-driver by generating a second control signal at the second circuit output.

15. A driver, comprising:

a first pre-driver having:

a first input, a first output, a first logic gate circuit having a first logic gate circuit input coupled to the first input and a first logic gate circuit output, and a first transistor pair, wherein a first terminal of a first transistor of the first transistor pair is coupled with a first terminal of a second transistor of the first transistor pair, a second terminal of the first transistor of the first transistor pair is coupled with a second terminal of the second transistor of the first transistor pair, and a control terminal of the second transistor of the first transistor pair is coupled to the first logic gate circuit output;

a first transistor having a first transistor control terminal coupled to the first output;

a second pre-driver having:
  a second input,
  a second output,
  a second logic gate circuit having a second logic gate circuit input coupled to the second input and a second logic gate circuit output, and
  a second transistor pair,
  wherein a first terminal of a first transistor of the second transistor pair is coupled with a first terminal of a second transistor of the second transistor pair, a second terminal of the first transistor of the second transistor pair is coupled with a second terminal of the second transistor of the second transistor pair, and a control terminal of the second transistor of the second transistor pair is coupled to the second logic gate circuit output;

a second transistor having a second transistor control terminal coupled to the second output, the second transistor coupled to the first transistor and to a driver output terminal; and a circuit coupled between the driver output terminal and the first input and between the driver output terminal and the second input.

16. The driver of claim 15, wherein the circuit has first and second power supply terminals, a first circuit output and a second circuit output, the first circuit output coupled to the first input and the second circuit output coupled to the second input, the circuit configured to:

generate a first logic signal at the first circuit output in response to whether a voltage at the driver output terminal is smaller than a supply voltage at the first power supply terminal; and generate a second logic signal at the second circuit output in response to whether the voltage at the driver output terminal is larger than a power supply reference voltage at the second power supply terminal.

17. The driver of claim 16, wherein the circuit comprises:
a third transistor having a third transistor control terminal coupled to the first transistor control terminal;
a current mirror having a current mirror input and a current mirror output, the current mirror input coupled to the third transistor;
a current source circuit coupled to the current mirror output; and
a Schmitt trigger circuit having an input and an output, the input of the Schmitt trigger circuit coupled to the current mirror output and the current source circuit, and the output of the Schmitt trigger circuit coupled to the first circuit output.

18. The driver of claim 16, wherein the second transistor has first and second current terminals, and wherein the circuit comprises:
a Schmitt trigger circuit having an input and an output, the output of the Schmitt trigger circuit coupled to the second circuit output;
a third transistor coupled between the first current terminal and the input of the Schmitt trigger circuit;
a resistor coupled between the second current terminal and the input of the Schmitt trigger circuit.

19. The driver of claim 15, wherein:
the first pre-driver has an adaptable drive strength for turning off the first transistor; and
the second pre-driver has an adaptable drive strength for turning off the second transistor.

20. The driver of claim 19, wherein:
the first pre-driver has a three-level adaptable drive strength for turning off the first transistor; and
the second pre-driver has a three-level adaptable drive strength for turning off the second transistor.

* * * * *